(12) United States Patent
Shimizu

(10) Patent No.: US 11,348,851 B2
(45) Date of Patent: May 31, 2022

(54) CASE WITH A PLURALITY OF PAIR CASE COMPONENTS FOR A SEMICONDUCTOR DEVICE

(71) Applicant: Mitsubishi Electric Corporation, Tokyo (JP)

(72) Inventor: Yasutaka Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 11 days.

(21) Appl. No.: 17/106,636

(22) Filed: Nov. 30, 2020

(65) Prior Publication Data

US 2021/0296189 A1 Sep. 23, 2021

(30) Foreign Application Priority Data

Mar. 18, 2020 (JP) .............................. JP2020-047293

(51) Int. Cl.
*H01L 23/48* (2006.01)
*H01L 23/34* (2006.01)
(Continued)

(52) U.S. Cl.
CPC ............ *H01L 23/049* (2013.01); *B23K 3/047* (2013.01); *H01L 21/4817* (2013.01); *H01L 21/4871* (2013.01); *H01L 21/565* (2013.01); *H01L 23/053* (2013.01); *H01L 23/055* (2013.01); *H01L 23/10* (2013.01); *H01L 23/3121* (2013.01); *H01L 23/367* (2013.01); *H01L 23/3735* (2013.01); *H01L 23/48* (2013.01); *H01L 2924/181* (2013.01)

(58) Field of Classification Search
CPC ............. H01L 21/4817; H01L 21/4871; H01L 21/565; H01L 2924/181; H01L 23/049; H01L 23/10; H01L 23/3121; H01L 23/367; H01L 23/142; H01L 23/36; H01L 23/73; H01L 23/3735; H01L 23/053; H01L 23/055; H01L 23/48
See application file for complete search history.

(56) References Cited

U.S. PATENT DOCUMENTS

| 7,663,886 B2 * | 2/2010 | Aoki ........................ H01L 23/24 361/796 |
| 2012/0306091 A1 * | 12/2012 | Stolze ..................... H01L 24/24 29/842 |
| 2014/0299982 A1 * | 10/2014 | Minamio .............. H01L 23/495 257/786 |

FOREIGN PATENT DOCUMENTS

| CN | 109585401 A * | 4/2019 | ........... H01L 23/053 |
| JP | 2005-150170 A | 6/2005 | |

(Continued)

*Primary Examiner* — Alonzo Chambliss
(74) *Attorney, Agent, or Firm* — Studebaker & Brackett PC

(57) ABSTRACT

An object is to provide a technology for enabling reduction in the time and cost taken to manufacture a die to be used for molding a case that surrounds semiconductor elements. A semiconductor device includes a base plate, a cooling plate, an insulating substrate, a semiconductor element, a case, a lead frame formed integrally with the case and including a terminal formed on one end portion of the lead frame and protruding outward, and a sealant. The case includes a pair of first case components arranged to face each other, and a pair of second case components arranged to face each other and crossing the pair of first case components. Joining end portions of the first case components to end portions of the pair of second case components forms the case.

11 Claims, 11 Drawing Sheets

(51) Int. Cl.
    *H01L 21/00*     (2006.01)
    *H05K 7/00*     (2006.01)
    *H05K 5/00*     (2006.01)
    *H01L 23/049*     (2006.01)
    *H01L 23/10*     (2006.01)
    *H01L 23/367*     (2006.01)
    *H01L 21/56*     (2006.01)
    *H01L 21/48*     (2006.01)
    *H01L 23/31*     (2006.01)
    *H01L 23/373*     (2006.01)
    *H01L 23/055*     (2006.01)
    *H01L 23/053*     (2006.01)
    *B23K 3/047*     (2006.01)

(56) References Cited

FOREIGN PATENT DOCUMENTS

| | | | | | |
|---|---|---|---|---|---|
| JP | 2013239697 | A | * | 11/2013 | ............. H01L 24/49 |
| JP | 2018031590 | A | * | 3/2018 | |
| WO | WO-2011040313 | A1 | * | 4/2011 | ........... B23K 1/0006 |

* cited by examiner

CASE WITH A PLURALITY OF PAIR CASE COMPONENTS FOR A SEMICONDUCTOR DEVICE

BACKGROUND OF THE INVENTION

Field of the Invention

The present disclosure relates to a semiconductor device including a case surrounding semiconductor elements, and a method for manufacturing the semiconductor device.

Description of the Background Art

Semiconductor devices each include a case surrounding semiconductor elements. Since this case has an integral structure, it takes a large amount of time and cost to manufacture a die to be used for molding the case.

For example, Japanese Patent Application Laid-Open No. 2005-150170 (hereinafter referred to as Patent Document 1) discloses a vessel consisting of a pair of plates arranged parallel to face each other and a tubular part assembled from at least two side plates between the pair of plates.

Each of the side plates includes recesses continuously or intermittently formed on the inner wall along a pair of end portions that form an opening of the tubular part, and engaging portions formed along another pair of end portions of the side plate and each engaging the side plates while the engaging portions are assembled as the tubular part. Each of the plates includes fitting parts which fit into the recesses of the side plates and are disposed adjacent on the plate. Furthermore, fitting of the fitting parts into the recesses fixes the plates in the axial direction of the tubular part. This enables a vessel with a new form to be easily produced at low cost.

The case surrounding semiconductor elements needs to be equipped with a terminal to be connected to an external wire. However, since the side plates are formed by heat bending a synthetic resin panel according to the technology described in Patent Document 1, the terminal cannot be attached to the synthetic resin panel before the heat bending. Thus, the technology described in Patent Document 1 cannot solve a problem on the time and cost taken to manufacture a die.

SUMMARY

An object of the present disclosure is to provide a technology for enabling reduction in the time and cost taken to manufacture a die to be used for molding a case that surrounds semiconductor elements.

A semiconductor device according to the present disclosure includes a base plate, a cooling plate, an insulating substrate, a semiconductor element, a case, a lead frame, and a sealant. The cooling plate is fixed to a lower surface of the base plate. The insulating substrate is fixed to a region of an upper surface of the base plate except an outer edge portion of the upper surface. The semiconductor element is mounted on an upper surface of the insulating substrate. The case is fixed to the outer edge portion of the upper surface of the base plate, and surrounds the semiconductor element. The lead frame is formed integrally with the case, and includes a terminal formed on one end portion of the lead frame. The sealant is filled into the case to cover the semiconductor element. The case includes a pair of first case components arranged to face each other, and a pair of second case components arranged to face each other and crossing the pair of first case components. Joining end portions of the first case components to end portions of the pair of second case components forms the case.

This structure can reduce the time and cost taken to manufacture a die to be used for molding the case that surrounds the semiconductor element.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
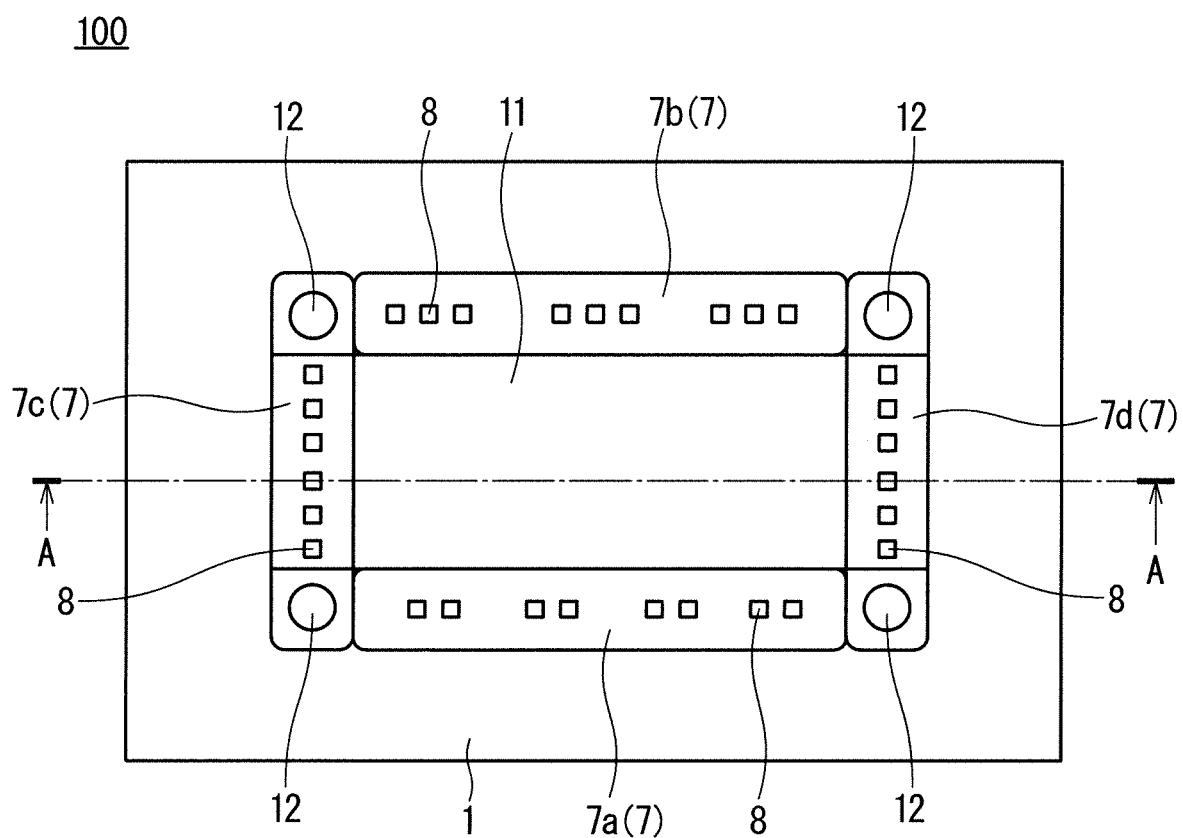
FIG. 1 is a plan view of a semiconductor device according to Embodiment 1.
Figure 2:
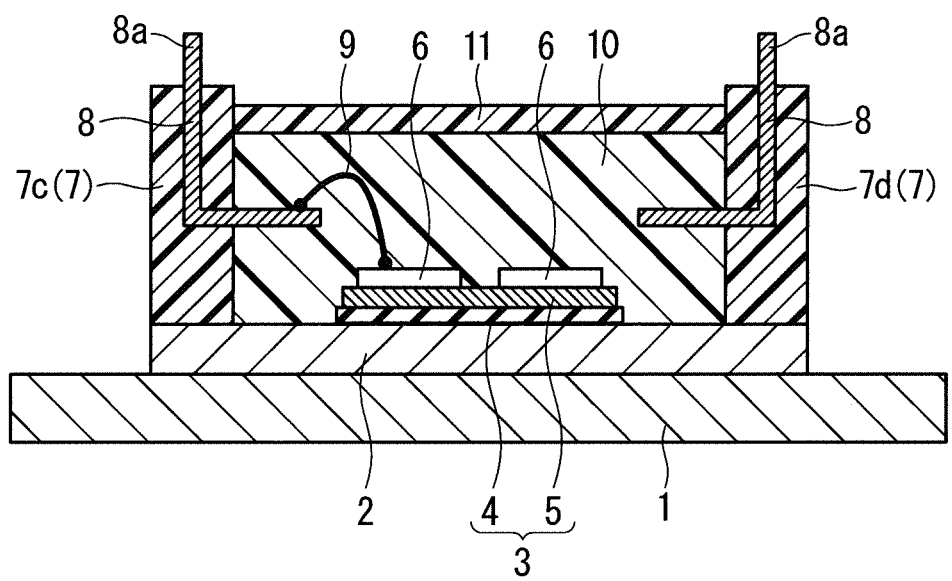
FIG. 2 illustrates a cross section taken along the line A-A of FIG. 1.

Embodiment 1 will be described with reference to the drawings. FIG. 1 is a plan view of a semiconductor device 100 according to Embodiment 1. FIG. 2 illustrates a cross section taken along the line A-A of FIG. 1.

As illustrated in FIGS. 1 and 2, the semiconductor device 100 includes a base plate 2, a cooling plate 1, an insulating substrate 3, semiconductor elements 6, a case 7, a lead frame 8, a sealant 10, and a lid 11.

The base plate 2 is, for example, made of a metal and rectangular. The cooling plate 1 is, for example, made of a metal and rectangular, and fixed to the lower surface of the base plate 2. Since the cooling plate 1 has a top view profile larger than that of the base plate 2, the outer periphery portion of the cooling plate 1 protrudes outward from the base plate 2.

The insulating substrate 3 is fixed to a region of the upper surface of the base plate 2 except its outer edge portion. The insulating substrate 3 includes an insulating layer 4, and a circuit pattern 5 formed on the upper surface of the insulating layer 4. The circuit pattern 5 is made of a metal such as copper.

The semiconductor elements 6 are mounted on the upper surface of the circuit pattern 5. Although two of the semiconductor elements 6 are mounted in FIG. 2, the number of the semiconductor elements 6 is not limited to two.

The case 7 is fixed to the outer edge portion of the upper surface of the base plate 2 with an adhesive, and also fixed to the base plate 2 and the cooling plate 1 with four bolts 12. The case 7 surrounds the insulating substrate 3 and the semiconductor elements 6. Here, the case 7 is not of an integral-type but divided into four sections. Joining longitudinal end portions of a pair of first case components 7a and 7b to longitudinal end portions of a pair of second case components 7c and 7d forms the case 7. The case 7 will be described later in detail.

The lead frame 8 includes terminals 8a each formed on one of the end portions. The lead frame 8 is formed integrally with the case 7 through insert molding. The other end portion of the lead frame 8 is connected to the semiconductor element 6 through a wire 9.

The sealant 10 is filled into the case 7 to cover the insulating substrate 3 and the semiconductor elements 6. The sealant 10 is a thermosetting resin, for example, an epoxy resin. The lid 11 is inserted into the inner periphery of the case 7 to cover the upper surface of the sealant 10. The lid 11 is, for example, a resin plate or a metal plate.

Figure 3:
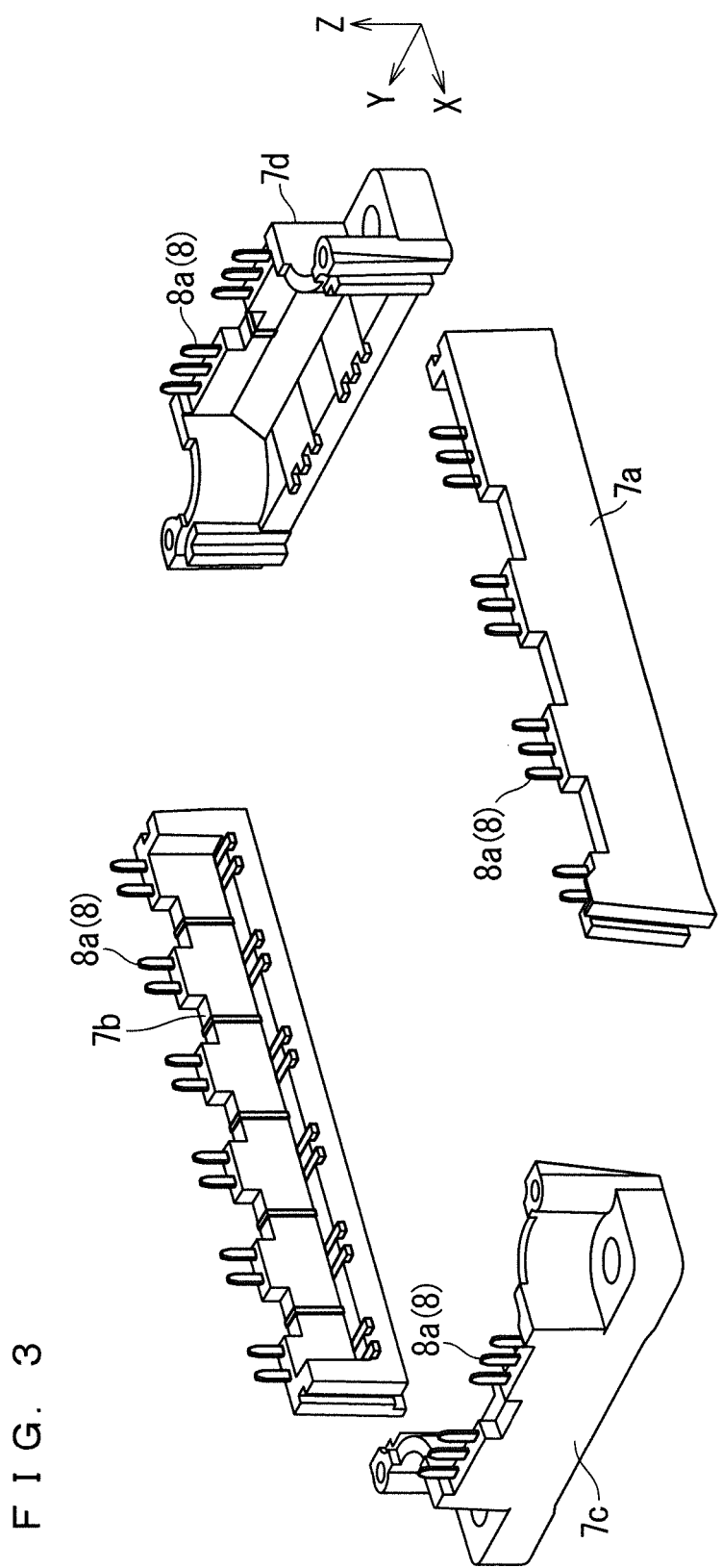
FIG. 3 is an exploded perspective view of a case included in the semiconductor device.
Figure 4:
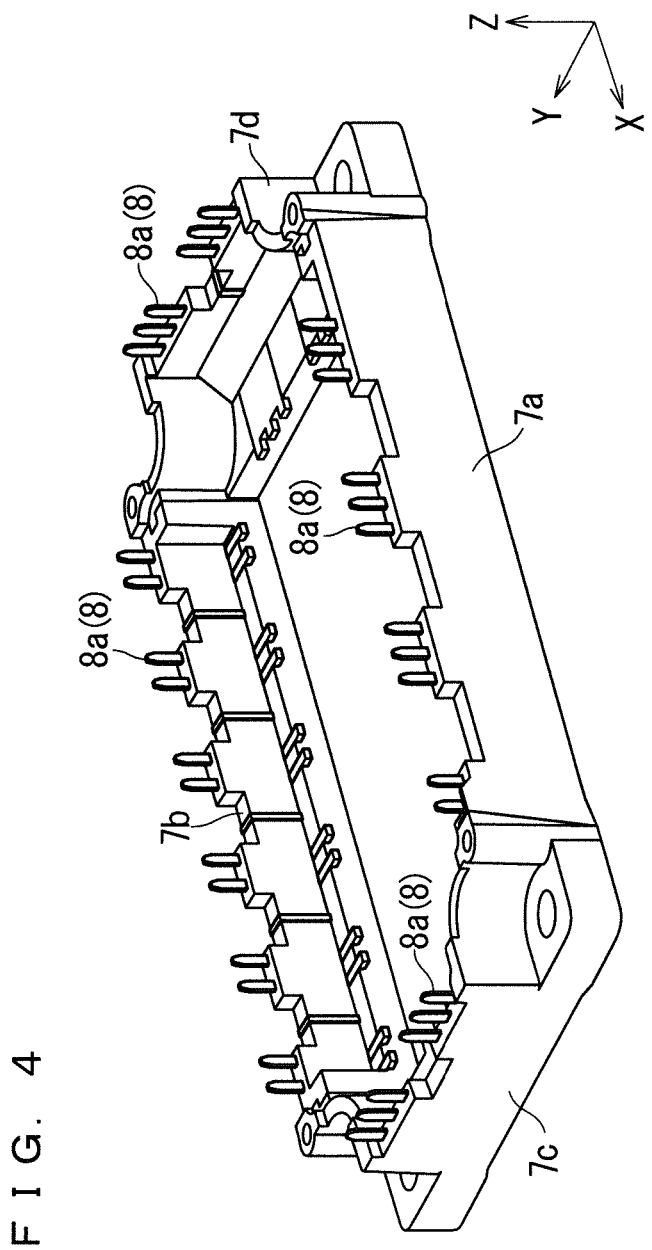
FIG. 4 is a perspective view of the case included in the semiconductor device.

Next, the details of the case 7 will be described. FIG. 3 is an exploded perspective view of the case 7. FIG. 4 is a perspective view of the case 7.

As illustrated in FIGS. 1, 3, and 4, the case 7 includes the pair of first case components 7a and 7b and the pair of second case components 7c and 7d. The first case components 7a and 7b are formed into an identical shape to extend in the X direction, and arranged to face each other in the Y direction. In other words, the pair of first case components 7a and 7b is a pair of wall parts facing in the Y direction.

The second case components 7c and 7d are formed into an identical shape to extend in the Y direction, and arranged to face each other in the X direction. In other words, the pair of second case components 7c and 7d is a pair of wall parts facing in the X direction. As illustrated in FIGS. 1 and 2, the bottom of the pair of first case components 7a and 7b and the pair of second case components 7c and 7d is fixed to the outer edge portion of the upper surface of the base plate 2.

Figure 5:
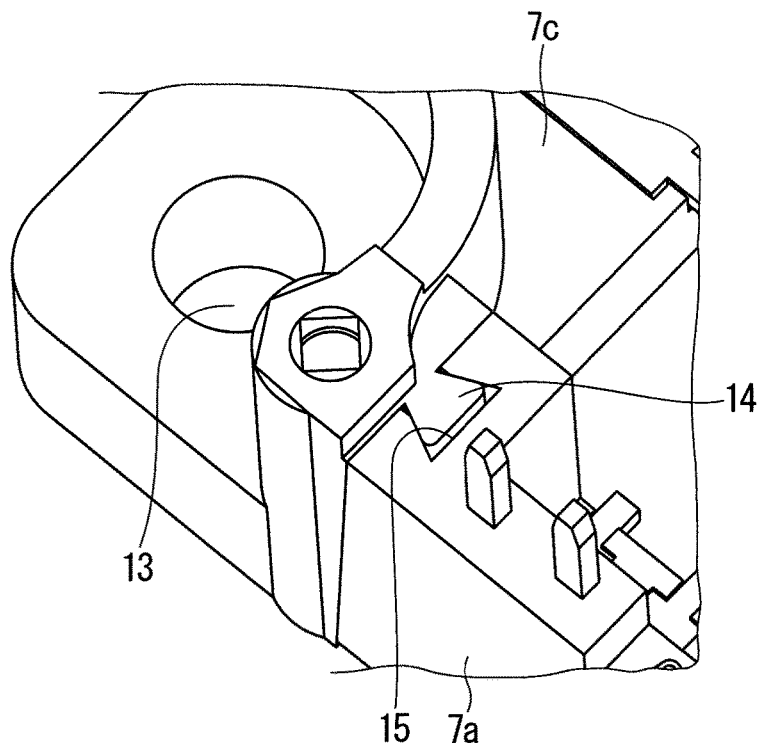
FIG. 5 is a perspective view illustrating an example joint between a first case component and a second case component.
Figure 6:
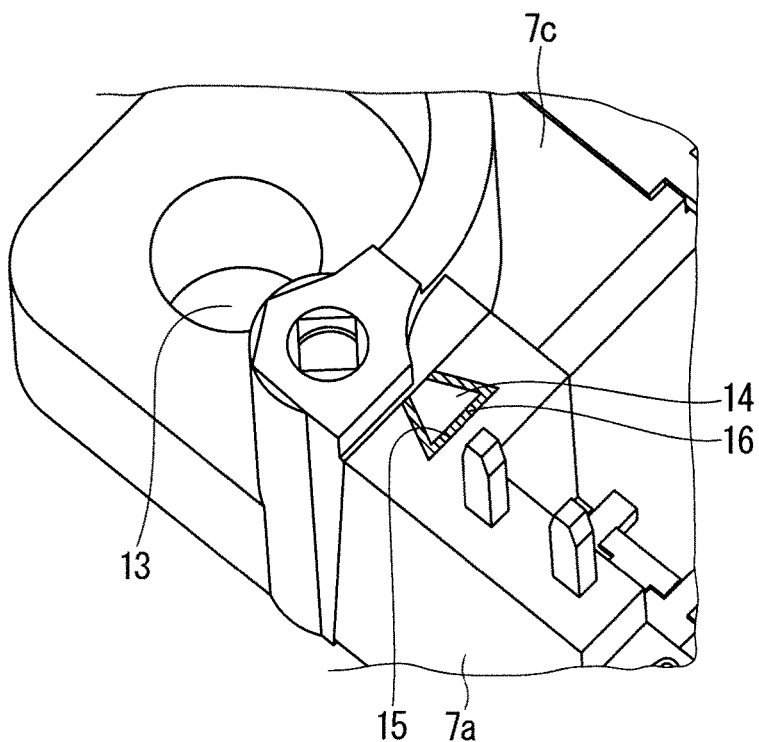
FIG. 6 is a perspective view illustrating another example joint between the first case component and the second case component.

Next, joining of the pair of first case components 7a and 7b to the pair of second case components 7c and 7d will be described. FIG. 5 is a perspective view illustrating an example joint between the first case component 7a and the second case component 7c. FIG. 6 is a perspective view illustrating another example joint between the first case component 7a and the second case component 7c. Since each of the pair of first case components 7a and 7b and the pair of second case components 7c and 7d has an identical shape, only the joint between the first case components 7a and the second case component 7c will be described herein.

As illustrated in FIGS. 3 to 5, a recess 15 that is horizontally recessed is formed at each of the longitudinal end portions of the first case component 7a. A protrusion 14 horizontally protruding and engaged in the recess 15 is formed at each of the longitudinal end portions of the second case component 7c. Each of the protrusions 14 of the second case component 7c is shaped like a trapezoid whose side at the tip is longer than its side at the base in a plan view. Each of the recesses 15 of the first case component 7a is shaped like a trapezoid whose side at the tip is shorter than its side at the base in a plan view.

The horizontal engagement of the recess 15 of the first case component 7a with the protrusion 14 of the second case component 7c joins the first case component 7a to the second case component 7c. This enables horizontal positioning between the first case component 7a and the second case component 7c. Thus, the case 7 can be easily assembled.

As illustrated in FIG. 6, the protrusion 14 of the second case component 7c may be fixed to the recess 15 of the first case component 7a further with an adhesive 16. This further strengthens the joint between the first case components 7a and the second case component 7c.

Figure 7:
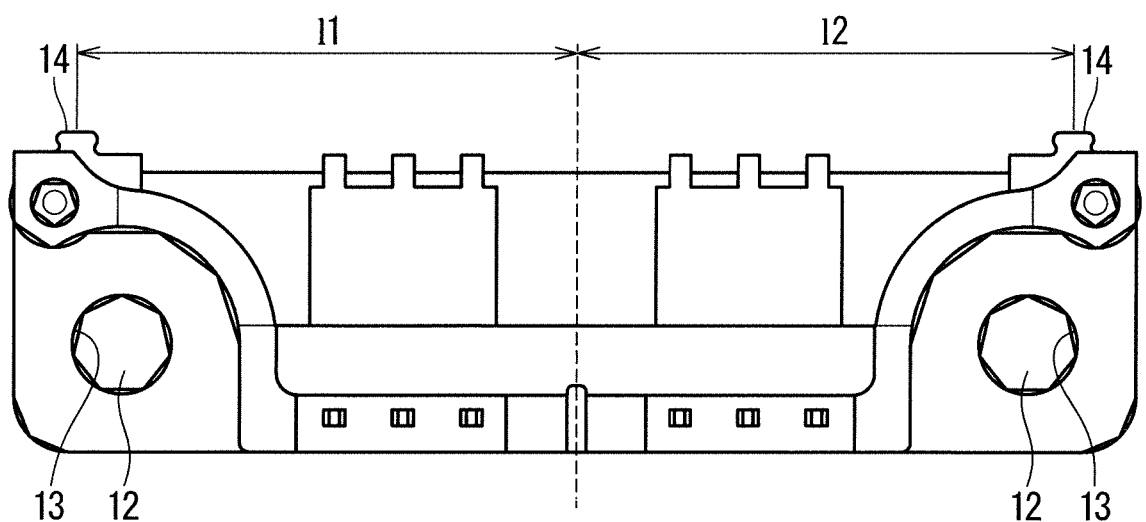
FIG. 7 is a plan view illustrating an example of the second case component.
Figure 8:
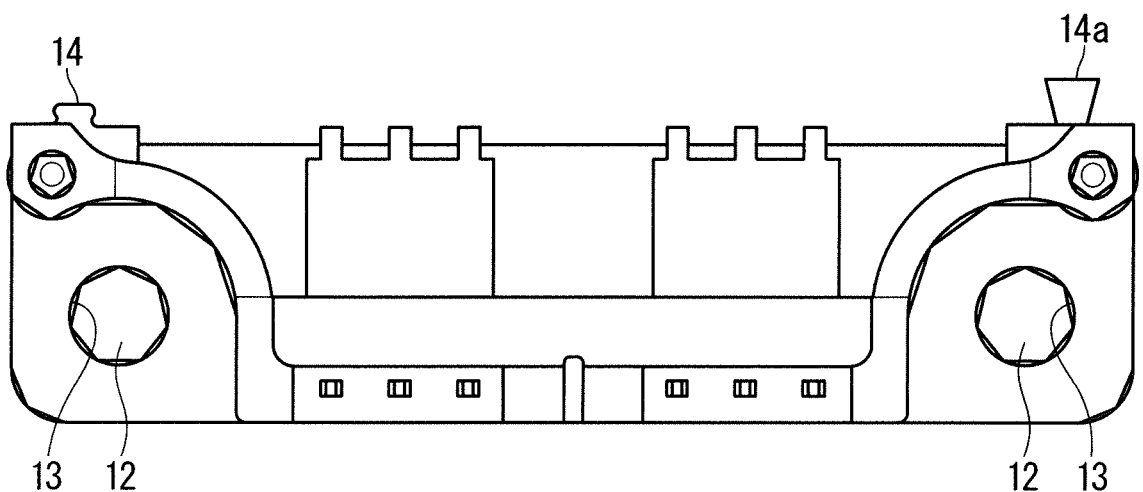
FIG. 8 is a plan view illustrating another example of the second case component.

Next, the shape of the second case components 7c and 7d will be described with reference to FIGS. 7 and 8. FIG. 7 is a plan view illustrating an example of the second case component 7c. FIG. 8 is a plan view illustrating another example of the second case component 7c. Since the second case components 7c and 7d have the same shape, only the shape of the second case component 7c will be described herein.

As illustrated in FIG. 7, the second case component 7c is asymmetrical in shape with respect to its center in a plan view. Specifically, lengths 11 and 12 each from the center to the protrusion 14 are different in the second case component 7c. Alternatively, although the lengths 11 and 12 each from the center to the protrusion 14 are the same, a protrusion 14a larger than the protrusion 14 is formed at one end portion of the second case component 7c as illustrated in FIG. 8.

Since the second case component 7c with the shape illustrated in FIG. 7 or 8 can prevent a mistake when the case 7 is assembled, yields of the case 7 can be increased.

Figure 9:
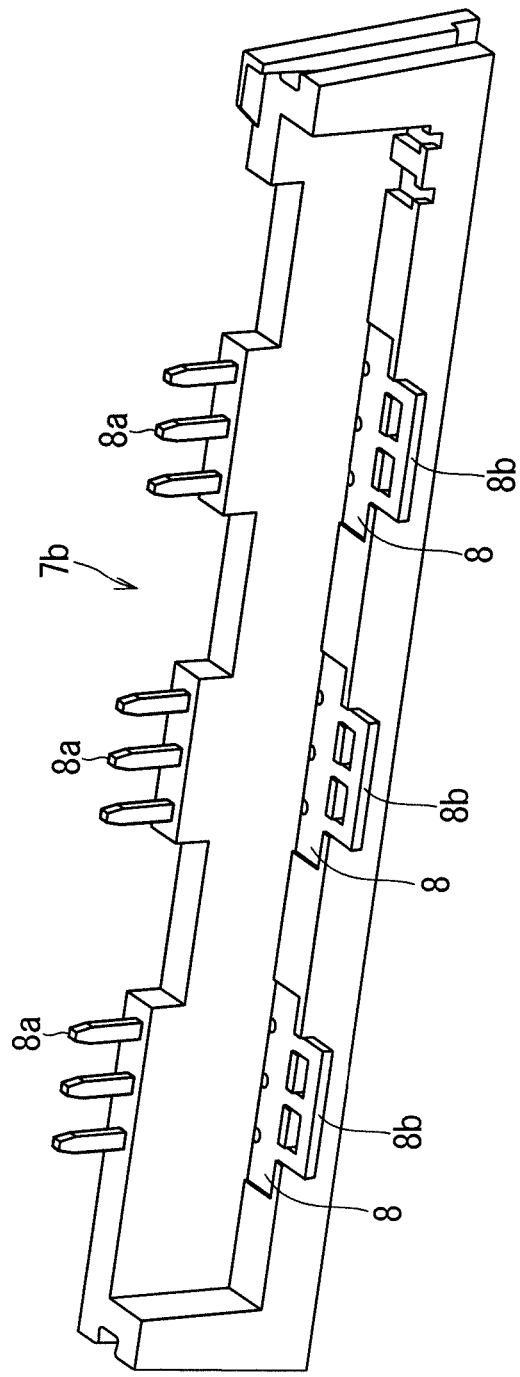
FIG. 9 is a perspective view illustrating a method for manufacturing the first case component.
Figure 10:
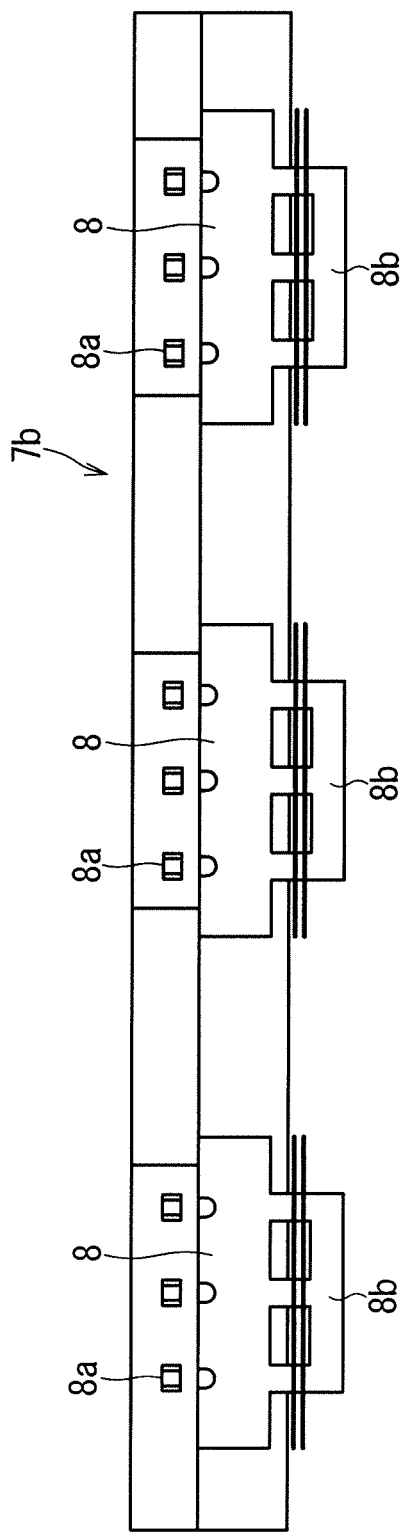
FIG. 10 is a plan view illustrating the method for manufacturing the first case component.
Figure 11:
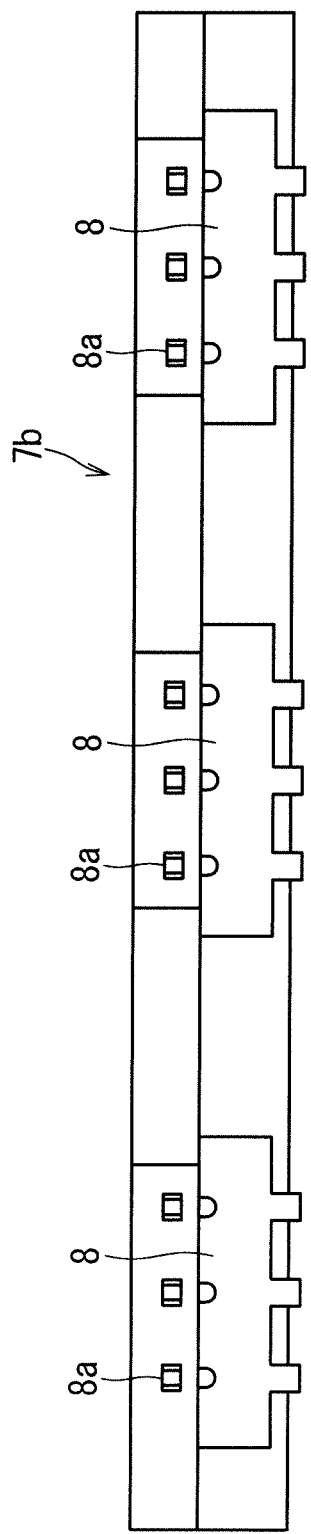
FIG. 11 is a plan view illustrating the method for manufacturing the first case component.

Next, a method for manufacturing the first case component 7b for forming a part of the case 7 will be described. FIG. 9 is a perspective view illustrating the method for manufacturing the first case component 7b. FIGS. 10 and 11 are plan views illustrating the method for manufacturing the first case component 7b. Since the first case component 7a and the second case components 7c and 7d are manufactured in the same method as that for the first case component 7b, the description will be omitted.

First, the lead frame 8 including tie bars 8b that are fixtures to a die is set to the die, Next, a resin is injected into the die to mold the first case component 7b. Furthermore, insert molding the lead frame 8 into the first case component 7b results in the obtainment of the first case component 7b as illustrated in FIG. 9. Cutting the tie bars 8b after the insert molding as illustrated in FIG. 10 results in the obtainment of the first case component 7b as illustrated in FIG. 11. The first case component 7b illustrated in FIG. 11 is used for assembling the case 7.

As described above, the semiconductor device 100 according to Embodiment 1 includes: the base plate 2; the cooling plate 1 fixed to a lower surface of the base plate 2; the insulating substrate 3 fixed to a region of an upper surface of the base plate 2 except an outer edge portion of the upper surface; the semiconductor element 6 mounted on an upper surface of the insulating substrate 3; a case 7 fixed to the outer edge portion of the upper surface of the base plate 2, the case 7 surrounding the semiconductor element 6; the lead frame 8 formed integrally with the case 7 and including the terminal 8a formed on one end portion of the lead frame 8; and the sealant 10 filled into the case 7 to cover the semiconductor element 6, the case 7 including the pair of first case components 7a and 7b arranged to face each other, and the pair of second case components 7c and 7d arranged to face each other and crossing the pair of first case components 7a and 7b, wherein joining end portions of the pair of first case components 7a and 7b to end portions of the pair of second case components 7c and 7d forms the case 7.

Since the case 7 can be manufactured in sections, i.e., the pair of first case components 7a and 7b and the pair of second case components 7c and 7d, the shape of the components can be simplified. This can reduce the time and cost taken to manufacture a die to be used for molding the case 7 that surrounds the semiconductor elements 6. Furthermore, simplifying the shape of the components can increase the yields of the case 7.

Figure 15:
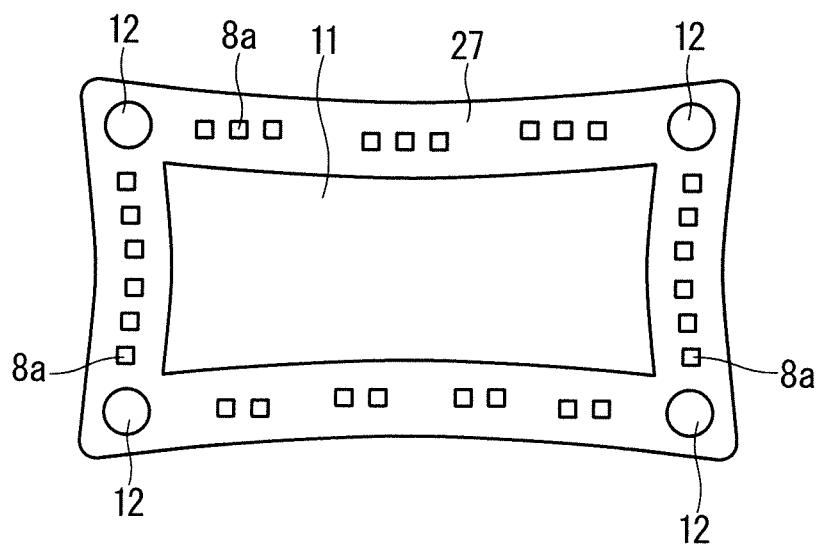
FIG. 15 is a plan view of a deformed integral case.

Furthermore, since dividing the case 7 into sections can reduce the stress applied to the case 7 when the base plate 2 is attached to the cooling plate 1 more than that to an integral case, the reliability of the semiconductor device 100 can be enhanced. Furthermore, an integral case 27 illustrated in FIG. 15 contracts and is deformed when manufactured. Thus, there are problems in the fit of the lid 11 to be inserted into the inner periphery of the case 27 and the difficulty in positioning of the terminals 8a. However, the semiconductor device 100 according to Embodiment 1 can solve such problems. FIG. 15 is a plan view of the deformed integral case 27.

Furthermore, the recess 15 that is horizontally recessed is formed at each of the end portions of the first case components 7a and 7b, the protrusion 14 horizontally protruding and engaged in the recess 15 is formed at each of the end portions of the second case components 7c and 7d, and the protrusions 14 are horizontally engaged in the recesses 15. Although the base plate 2 is vertically deformed when the semiconductor device 100 operates, the case 7 conforms to the vertical deformation. Since this can reduce the stress applied to the case 7 more than that to the integral case, the reliability of the semiconductor device 100 can be enhanced.

Since the bottom of the pair of first case components 7a and 7b and the pair of second case components 7c and 7d is fixed to the outer edge portion of the upper surface of the base plate 2, the stress applied to the case 7 can be further reduced. This can further enhance the reliability of the semiconductor device 100.

Since each of the protrusions 14 of the second case components 7c and 7d is shaped like a trapezoid whose side at the tip is longer than its side at the base in a plan view, this enables positioning between the first case components 7a and 7b and the second case components 7c and 7d. Thus, the case 7 can be easily assembled.

Since the protrusions 14 of the second case components 7c and 7d are fixed to the recesses 15 of the first case component 7a and 7b with the adhesive 16, this further strengthens the joints between the first case component 7a and 7b and the second case components 7c and 7d. Since this can prevent the leakage of the sealant 10, yields of the case 7 can be increased.

Since each of the pair of first case components 7a and 7b and the pair of second case components 7c and 7d has an identical shape, reduction in the number of types of the case components for forming the case 7 can shorten the time taken to manufacture the case 7.

Since each of the second case components 7c and 7d is asymmetrical in shape with respect to its center in a plan view, this can prevent a mistake when the case 7 is assembled. Thus, the yields of the case 7 can be increased.

A method for manufacturing the semiconductor device 100 includes: (a) setting, to a die, the lead frame 8 including the tie bars 8b that are fixtures to the die; (b) injecting a resin into the die to mold one of the pair of first case components 7a and 7b and the pair of second case components 7c and 7d, and insert molding the lead frame 8 into the one of the pair of first case components 7a and 7b and the pair of second case components 7c and 7d; and (c) cutting the tie bars 8b after the insert molding.

Since this can prevent the terminals 8a from being washed away by the resin when the first case components 7a and 7b and the second case components 7c and 7d are molded, the yields of the case 7 can be increased.

Embodiment 2

Figure 12:
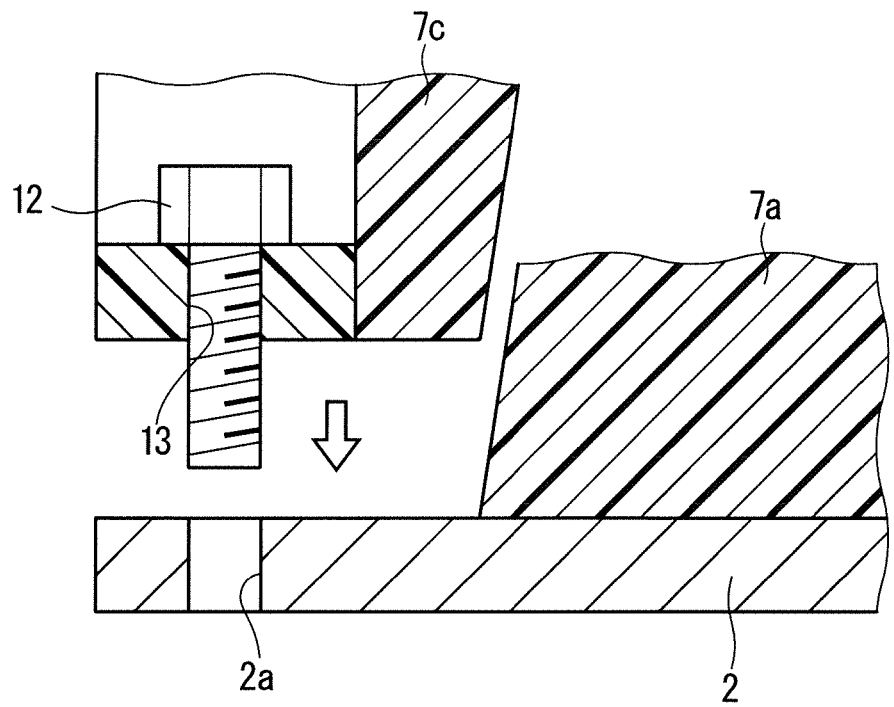
FIG. 12 is a cross-sectional view illustrating a state before the second case component is joined to the first case component in the semiconductor device according to Embodiment 2.
Figure 13:
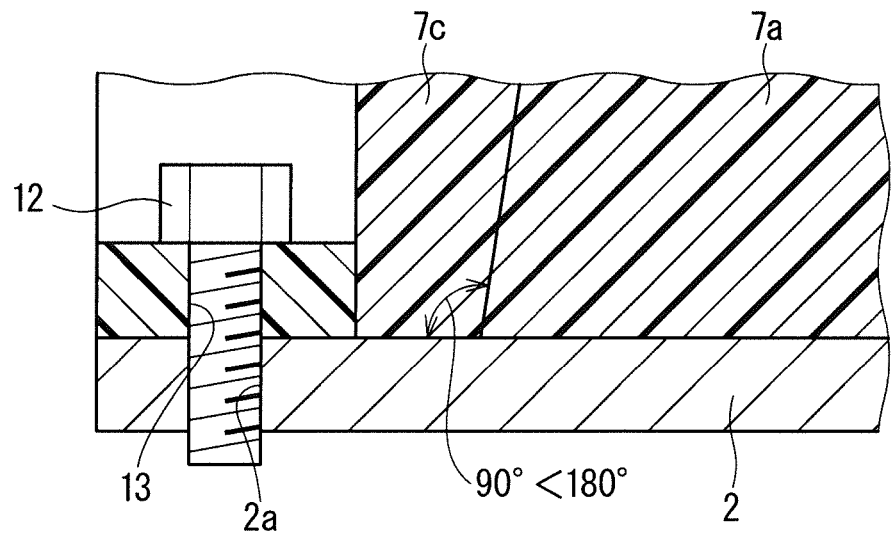
FIG. 13 is a cross-sectional view illustrating a state where the second case component is joined to the first case component in the semiconductor device according to Embodiment 2.

Next, the semiconductor device 100 according to Embodiment 2 will be described. FIG. 12 is a cross-sectional view illustrating a state before the second case component 7c is joined to the first case component 7a. FIG. 13 is a cross-sectional view illustrating a state where the second case component 7c is joined to the first case component 7a. In Embodiment 2, the same reference numerals are assigned to the same constituent elements described in Embodiment 1, and the description thereof will be omitted.

As illustrated in FIGS. 12 and 13, a structure of a joint between the first case component 7a and the second case component 7c according to Embodiment 2 differs from that according to Embodiment 1. The joint surface that is an end face of each of the longitudinal end portions of the first case component 7a is an oblique surface. Furthermore, the joint surface of each of the longitudinal end portions of the second case component 7c that is a surface closer to the first case component 7a or 7b is an oblique surface. While the joint surface of the first case component 7a is aligned to the joint surface of the second case component 7c, allowing the bolt 12 to pass through a screw hole 13 of the second case component 7c and a through hole 2a of the base plate 2 fastens the second case component 7c to the first case component 7a.

The joint surface of one of the first case component 7a and the second case component 7c with the joint surface of the other one of the first case component 7a and the second case component 7c satisfies angles 90°<180° with respect to the upper surface of the base plate 2. Specifically, the joint surface of the second case component 7c satisfies angles 90°<180° with respect to the upper surface of the base plate 2, and the joint surface of the first case component 7a satisfies angles 90°>0 with respect to the upper surface of the base plate 2. Alternatively, the joint surface of the first case component 7a satisfies angles 90°<180° with respect to the upper surface of the base plate 2, and the joint surface of the second case component 7c satisfies angles 90°>0 with respect to the upper surface of the base plate 2.

This enables horizontal positioning between the first case component 7a and the second case component 7c. Furthermore, the vertical shapes of the first case component 7a and the second case component 7c at the joint surfaces allow the first case component 7a or the second case component 7c to vertically move with flexibility.

When the joint surface of the second case component 7c including the screw hole 13 satisfies angles 90°<180° with respect to the upper surface of the base plate 2 as illustrated in FIG. 13, unnecessary vertical movement of the first case component 7a that is not fixed by screwing can be prevented.

As described above, the joint surfaces of the first case components 7a and 7b and the joint surfaces of the second case components 7c and 7d satisfy angles 90°<180° with respect to the upper surface of the base plate 2 in the semiconductor device 100 according to Embodiment 2. This enables horizontal positioning between the first case components 7a and 7b and the second case components 7c and 7d. Since this further allows the first case components 7a and 7b or the second case components 7c and 7d to vertically move with flexibility, the case 7 can be easily assembled.

Furthermore, the second case components 7c and 7d include the screw holes 13 for fixing the second case components 7c and 7d to the base plate 2, and have the joint surfaces satisfying angles 90°<180° with respect to the upper surface of the base plate 2.

This enables vertical positioning between the first case components 7a and 7b and the second case components 7c and 7d. The first case components 7a and 7b without the screw hole 13 have flexibility in the vertically movement. Although the base plate 2 is vertically deformed when the semiconductor device 100 operates, the case 7 conforms to the vertical deformation. This can reduce the stress applied to the case 7 more than that to an integral case, and prevent unnecessary vertical movement of the first case components 7a and 7b that are not fixed by screwing.

Embodiment 3

Figure 14:
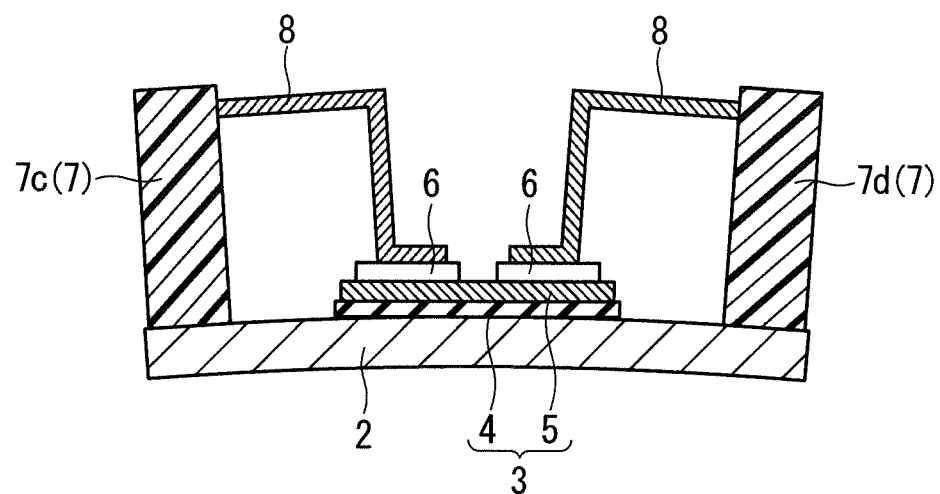
FIG. 14 is a cross-sectional view of the semiconductor device 100 according to Embodiment 3.

Next, the semiconductor device 100 according to Embodiment 3 will be described. FIG. 14 is a cross-sectional view of the semiconductor device 100 according to Embodiment 3. In Embodiment 3, the same reference numerals are assigned to the same constituent elements described in Embodiment 1, and the description thereof will be omitted.

As illustrated in FIG. 14, the lead frame 8 consists of a plurality of Direct Lead Bonding (DLB) frames according to Embodiment 3. The DLB frames are formed integrally with each of the first case components 7a and 7b and the second case components 7c and 7d. FIG. 14 omits the illustration of the cooling plate 1, the sealant 10, and the lid 11.

The DLB frames made of copper with high stiffness or formed from a plate made of aluminum need to be bonded to the semiconductor elements 6 according to Embodiment 3, unlike wiring the semiconductor elements 6 using the wire 9 according to Embodiments 1 and 2. Thus, the vertical positioning against a warpage of the base plate 2 requires high precision. However, dividing the case 7 into sections to allow the vertical movement of the sections enables the case 7 to easily conform to the warpage of the base plate 2.

As described above, the lead frame 8 consists of the plurality of DLB frames in the semiconductor device 100 according to Embodiment 3. The DLB frames are formed integrally with each of the first case components 7a and 7b and the second case components 7c and 7d.

Since the case 7 can conform to the warpage of the base plate 2, yields and the design flexibility of the semiconductor device 100 are increased.

Embodiments can be freely combined, and each of Embodiments can be appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a base plate;
a cooling plate fixed to a lower surface of the base plate;
an insulating substrate fixed to a region of an upper surface of the base plate except an outer edge portion of the upper surface;
a semiconductor element mounted on an upper surface of the insulating substrate;
a case fixed to the outer edge portion of the upper surface of the base plate, the case surrounding the semiconductor element;
a lead frame formed integrally with the case and including a terminal formed on one end portion of the lead frame; and
a sealant filled into the case to cover the semiconductor element,
the case including a pair of first case components arranged to face each other, and a pair of second case components arranged to face each other and crossing the pair of first case components,
wherein joining end portions of the pair of first case components to end portions of the pair of second case components forms the case.

2. The semiconductor device according to claim 1,
wherein a recess that is horizontally recessed is formed at each of the end portions of the first case components,
a protrusion horizontally protruding and engaged in the recess is formed at each of the end portions of the second case components, and
the protrusions are horizontally engaged in the recesses.

3. The semiconductor device according to claim 2,
wherein each of the protrusions of the second case components is shaped like a trapezoid whose side at a tip is longer than a side at a base in a plan view.

4. The semiconductor device according to claim 2,
wherein the protrusions of the second case components are fixed to the recesses of the first case components with an adhesive.

5. The semiconductor device according to claim 1,
wherein a bottom of the pair of first case components and the pair of second case components is fixed to the outer edge portion of the upper surface of the base plate.

6. The semiconductor device according to claim 1,
wherein the lead frame consists of a plurality of Direct Lead Bonding (DLB) frames, and
the plurality of DLB frames are formed integrally with each of the pair of first case components and the pair of second case components.

7. The semiconductor device according to claim 1,
wherein a joint surface of one of the pair of first case components and the pair of second case components with a joint surface of the other one of the pair of first case components and the pair of second case components satisfies angles 90°<180° with respect to the upper surface of the base plate.

8. The semiconductor device according to claim 7,
wherein each of the second case components includes screw holes for fixing the second case component to the base plate, and
each of the second case components has the joint surface satisfying the angles 90°<180° with respect to the upper surface of the base plate.

9. The semiconductor device according to claim 1,
wherein each of the pair of first case components and the pair of second case components has an identical shape.

10. The semiconductor device according to claim 1, wherein each of the second case components is asymmetrical in shape with respect to a center of the second case component in a plan view.

11. A method for manufacturing the semiconductor device according to claim 1, the method comprising:
 (a) setting, to a die, the lead frame including a tie bar that is a fixture to the die;
 (b) injecting a resin into the die to mold one of the pair of first case components and the pair of second case components, and insert molding the lead frame into the one of the pair of first case components and the pair of second case components; and
 (c) cutting the tie bar after the insert molding.

* * * * *